(12) United States Patent
Cai

(10) Patent No.: US 8,450,620 B2
(45) Date of Patent: May 28, 2013

(54) ELECTRONIC ASSEMBLY AND METHOD FOR MANUFACTURING SAME

(75) Inventor: You-Hua Cai, Keelung (TW)

(73) Assignee: Lotes Co., Ltd., Keelung (TW)

( * ) Notice: Subject to any disclaimer, the term of this patent is extended or adjusted under 35 U.S.C. 154(b) by 235 days.

(21) Appl. No.: 13/050,599

(22) Filed: Mar. 17, 2011

(65) Prior Publication Data

US 2012/0145444 A1 Jun. 14, 2012

(30) Foreign Application Priority Data

Dec. 14, 2010 (CN) .......................... 2010 1 0592047

(51) Int. Cl.
*H05K 1/16* (2006.01)
*H01R 12/72* (2006.01)

(52) U.S. Cl.
CPC .................................. *H01R 12/721* (2013.01)
USPC .......................................... 174/260; 174/250

(58) Field of Classification Search
CPC ......... H01R 12/721; H01R 4/027; H05K 1/117
USPC ........... 174/250, 260; 228/248.1, 178, 179.1, 228/180.1–180.5; 439/607.35, 78, 79, 92, 439/95, 101, 607

See application file for complete search history.

(56) References Cited

U.S. PATENT DOCUMENTS

| 7,607,947 | B1 * | 10/2009 | Ho ............................ 439/607.36 |
| 8,337,248 | B1 * | 12/2012 | Lan et al. ................. 439/607.35 |
| 2008/0057795 | A1 * | 3/2008 | Chen ............................ 439/723 |
| 2009/0029567 | A1 * | 1/2009 | Yi ................................ 439/66 |
| 2012/0052725 | A1 * | 3/2012 | Yang ....................... 439/607.01 |

* cited by examiner

*Primary Examiner* — Yuriy Semenenko

(74) *Attorney, Agent, or Firm* — Morris Manning & Martin LLP; Tim Tingkang Xia, Esq.

(57) ABSTRACT

An electronic assembly is provided, which includes a circuit board, in which a solder pad is disposed at a position close to an end edge on at least one surface of the circuit board, and a depression is disposed between the solder pad and the end edge; and, an electronic element, including an insulating body and a plurality of terminals fixed to the insulating body, in which each of the terminals has a protruding portion and a soldering portion respectively corresponding to the depression and the solder pad. A method for manufacturing the electronic assembly is also provided.

10 Claims, 7 Drawing Sheets

ELECTRONIC ASSEMBLY AND METHOD FOR MANUFACTURING SAME

CROSS-REFERENCE TO RELATED APPLICATIONS

This non-provisional application claims priority under 35 U.S.C. §119(a) on Patent Application No(s). 201010592047.3 filed in China on Dec. 14, 2010, the entire contents of which are hereby incorporated by reference.

FIELD OF THE INVENTION

The present invention relates to an electronic assembly and a method for manufacturing the same, and more particularly to an electronic assembly including a circuit board and an electronic element inserted along an end edge of the circuit board and a method for manufacturing the same.

BACKGROUND OF THE INVENTION

In order to reduce the height of a main board, recently in some electronic assemblies, an electronic element such as an electrical connector is inserted along one end of a circuit board and soldered on a surface of the circuit board. Before assembly, solder pastes are printed on the surface of the circuit board at matching positions corresponding to terminals of the electronic element. During assembly, the electronic element and the circuit board are inserted into each other, and at this time, the terminals of the electronic element respectively push the solder pastes on the circuit board, and the solder pastes are scraped off, such that weak soldering is caused due to excessively small volume of solder pastes on solder joints, or short circuit is resulted in due to contact of adjacent solder pastes, thereby influencing the normal operation of the electronic element.

Therefore, a heretofore unaddressed need exists in the art to address the aforementioned deficiencies and inadequacies.

SUMMARY OF THE INVENTION

In one aspect, the present invention is directed to an electronic assembly and a method for manufacturing the same, which are capable of avoiding excessively small volume of solder pastes on solder joints and contact of adjacent solder pastes.

In one embodiment, the present invention provides an electronic assembly that includes: a circuit board, in which a solder pad is disposed at a position close to an end edge on at least one surface of the circuit board, and a depression is disposed between the solder pad and the end edge, and an electronic element, including an insulating body and a plurality of terminals fixed to the insulating body, in which each of the terminals has a protruding portion and a soldering portion respectively corresponding to the depression and the solder pad, and due to the height of the protruding portion and the soldering portion, when the electronic element is inserted along the end edge, the protruding portion is firstly propped open by the circuit board, and drives the soldering portion to deflect outwards and be located at an outer side of the solder paste correspondingly disposed on the solder pad, and when the electronic element is inserted to a prearranged position and the protruding portion enters into the depression, the soldering portion of the terminal returns and contacts the solder paste.

Compared with the prior art, the terminals of the electronic assembly of the present invention will not push the solder pastes, and thus not only enough volume of solder pastes and good soldering are ensured, but also the adjacent solder pastes will not contact each other, thereby avoiding short circuit.

Preferably, the solder pads are disposed on a top surface and a bottom surface of the circuit board, and correspondingly, the soldering portions of the electronic element are arranged into two rows to match the solder pads on the top surface and the bottom surface respectively, which increases the density of solder joints, and is beneficial to miniaturization of the electronic assembly.

Preferably, each surface has a plurality of solder pads thereon, and each of the solder pads is corresponding to one of the depressions, which is beneficial to maintaining the strength of the circuit board.

Preferably, each surface has a plurality of solder pads thereon, and the depression is strip-shaped and is corresponding to all the solder pads on the same surface, which can facilitate the processing of the circuit board.

Preferably, the circuit board has a through hole disposed between the end edge and the solder pad, and an opening of the through hole forms the depression. Such a through hole structure can facilitate the processing of the circuit board.

The present invention further provides a method for manufacturing an electronic assembly. In one embodiment, the method includes: providing a circuit board, in which a solder pad is disposed at a position close to an end edge on at least one surface of the circuit board, and a depression is disposed between the solder pad and the end edge; providing a solder paste, correspondingly disposed on the solder pad; providing an electronic element, in which the electronic element includes an insulating body and a plurality of terminals fixed to the insulating body, and each of the terminals has a protruding portion and a soldering portion respectively corresponding to the depression and the solder pad; inserting the electronic element into the circuit board along the end edge, and during the process, the protruding portion is firstly propped open by the circuit board, and drives the soldering portion to deflect outwards and not contact the corresponding solder paste, and when the electronic element is inserted to a prearranged position, the protruding portion enters into the depression, and the soldering portion of the terminal returns and contacts the solder paste; and heating, to melt the solder paste, so as to electrically connect the soldering portion and the solder pad. Compared with the prior art, the terminals of the electronic assembly of the present invention will not push the solder pastes, and thus not only enough volume of solder pastes and good soldering are ensured, but also the adjacent solder pastes will not contact each other, thereby avoiding short circuit.

Preferably, the solder pads are disposed on a top surface and a bottom surface of the circuit board, and correspondingly, the soldering portions of the electronic element are arranged into two rows to match the solder pads on the top surface and the bottom surface respectively, which increases the density of solder joints, and is beneficial to miniaturization of the electronic assembly.

Preferably, the circuit board has a through hole disposed between the end edge and the solder pad, and an opening of the through hole forms the depression, which can facilitate the processing of the circuit board.

These and other aspects of the present invention will become apparent from the following description of the preferred embodiment taken in conjunction with the following drawings and their captions, although variations and modifications therein may be affected without departing from the spirit and scope of the novel concepts of the disclosure.

DETAILED DESCRIPTION OF THE INVENTION

Figure 1:
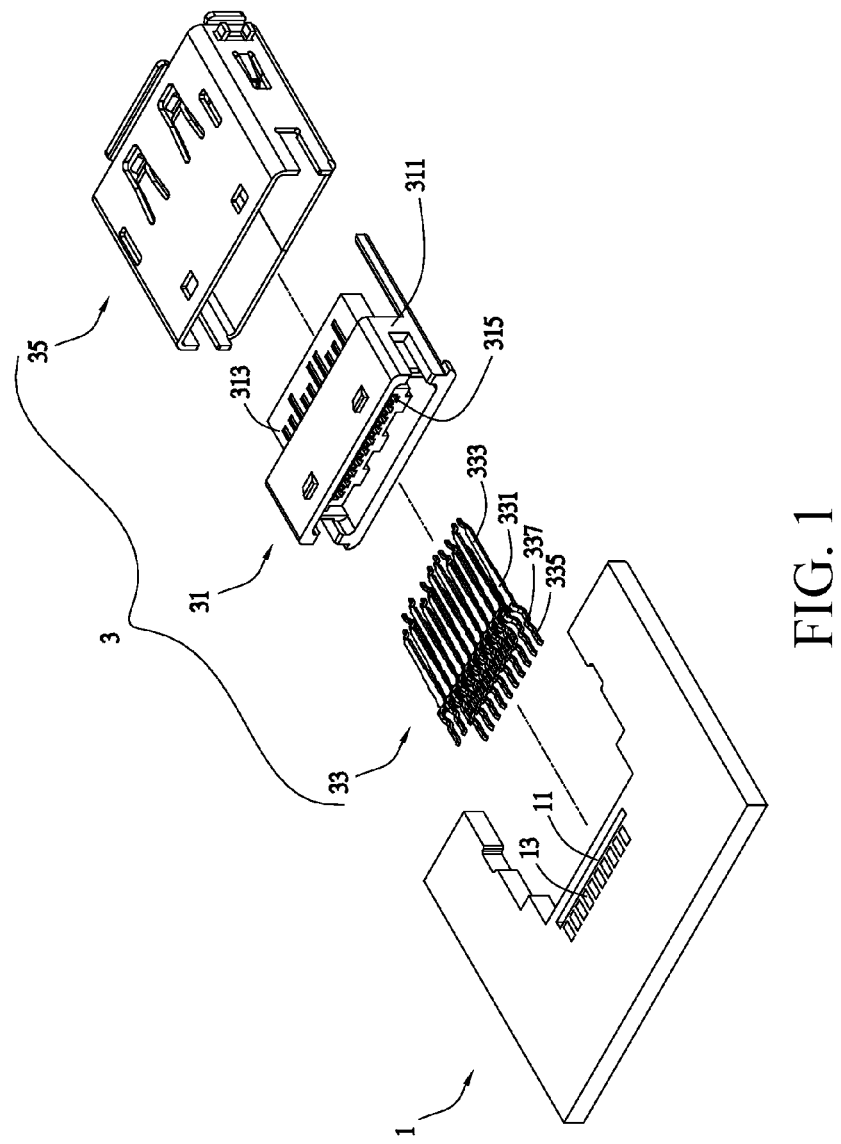
FIG. 1 is a three-dimensional exploded view of an electronic assembly according to a first embodiment of the present invention.

The present invention is more particularly described in the following examples that are intended as illustrative only since numerous modifications and variations therein will be apparent to those skilled in the art. Various embodiments of the invention are now described in detail. Referring to the drawings, FIGS. 1-7, like numbers, if any, indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

A list of reference numerals with corresponding components as shown in the drawings is given below only for the purpose of a reader's convenience:

Circuit board 1
Through hole 11
Solder pad 13
Depression 15
Electronic element 3
Insulating body 31
Base 311
Tongue plate 313
Terminal receiving slot 315
Terminal 33
Fixing portion 331
Mating portion 333
Soldering portion 335
Protruding portion 337
Shield 35
Solder paste 5

To make the objectives, structures, features and effects of the present invention more comprehensible, the electronic assembly and the method for manufacturing the same according to the present invention are further described in detail below with reference to the accompanying drawings and specific embodiments.

Figure 2:
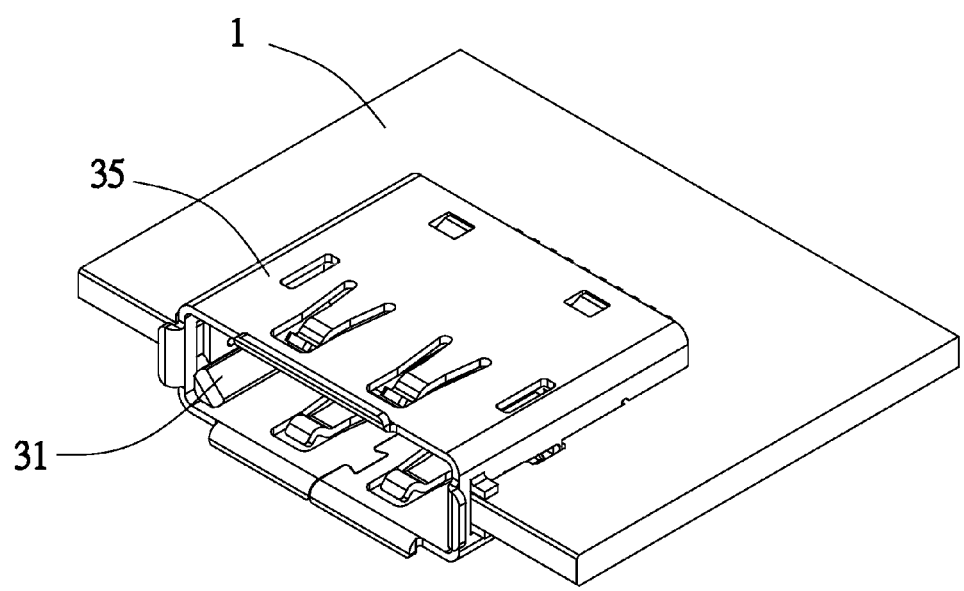
FIG. 2 is a three-dimensional assembled view of the electronic assembly in FIG. 1.
Figure 3:
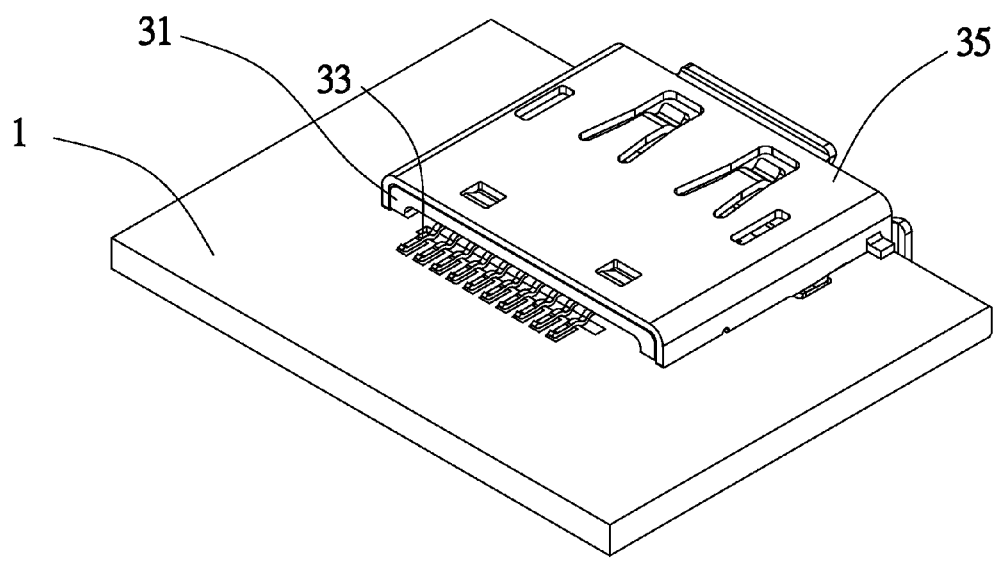
FIG. 3 is a three-dimensional assembled view of the electronic assembly in FIG. 1 from another angle.

Referring now to FIGS. 1 to 3, in a preferred embodiment of the present invention, an electronic assembly includes a circuit board 1 and an electronic element 3.

Figure 4:
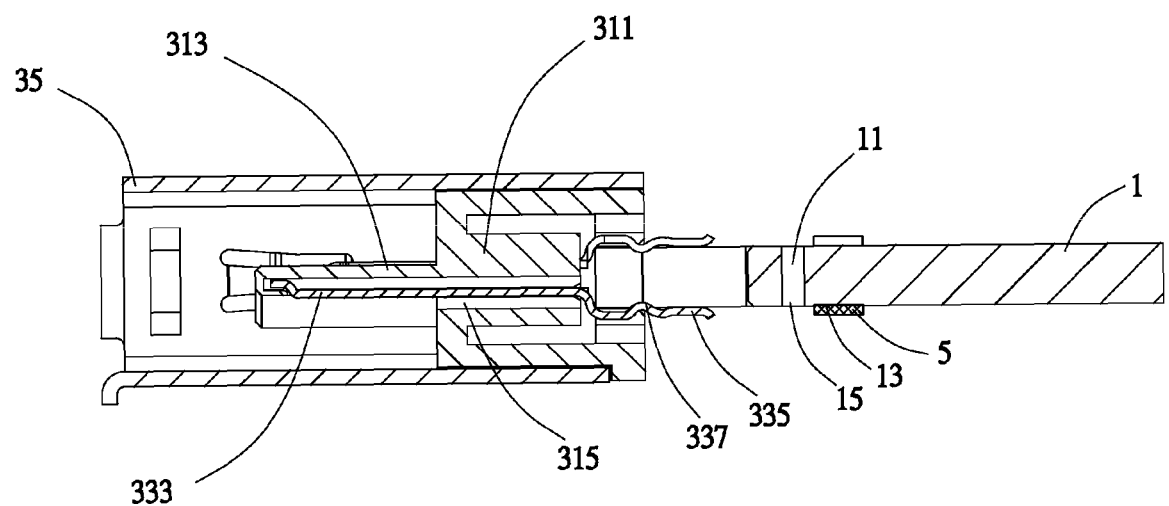
FIG. 4 is a sectional view of the electronic assembly in FIG. 1 before inserting a circuit board and an electronic element.
Figure 7:
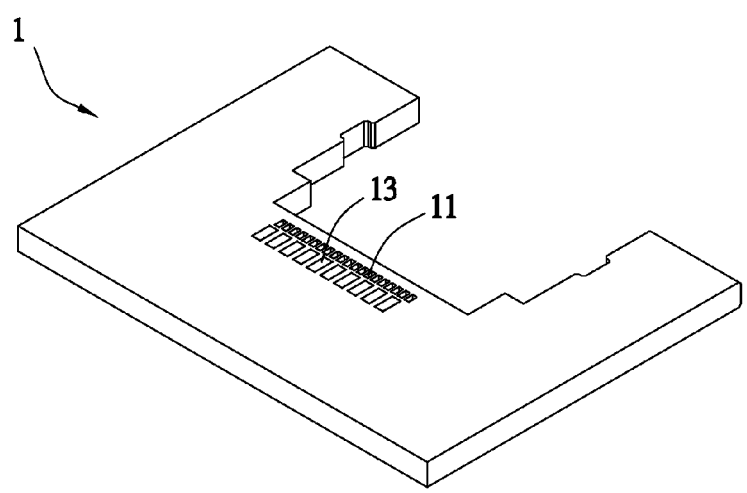
FIG. 7 is a three-dimensional view of a circuit board in an electronic assembly according to another embodiment of the present invention.

A plurality of solder pads 13 is disposed at a position close to an end edge on a top surface and a bottom surface of the circuit board 1 (in other embodiments, only one solder pad 13 may be disposed), a strip-shaped through hole 11 is disposed between the solder pad 13 and the end edge, and the through hole 11 is corresponding to all the solder pads 13 (in this embodiment, the width of the through hole 11 is larger than or equal to that of all the solder pad 13). As both the top surface and the bottom surface of the structure in this embodiment are soldered, the solder pads 13 are disposed on both the top surface and the bottom surface, and if only one surface is soldered, the solder pads only need to be disposed on this surface. The through hole 11 is disposed to form a depression 15 at an opening thereof (as shown in FIG. 4, the function is to be detailed below), so the depression 15 may be directly disposed on the surface of the circuit board 1, but the arrangement of the through hole 11 can facilitate the processing of the circuit board 1. The strip-shaped design of the through hole 11 is also for the purpose of facilitating the processing, but a plurality of through holes (as shown in FIG. 7) or depressions of other forms may also be disposed according to actual conditions. Each of the solder pads 13 is corresponding to one of the depressions 15. The arrangement of a plurality of depressions instead of one depression can maintain the strength of the circuit board 1.

The electronic element 3 in an embodiment is an electrical connector, and has one end soldered to the circuit board 1 and the other end connected to a mating electronic element (not shown). Alternatively, the electronic element is not limited to the electrical connector, and may also be other assemblies, such as a chip module or a light emitting diode (LED).

The electrical connector 3 includes an insulating body 31, a plurality of terminals 33 fixed to the insulating body 31, and a shield 35 wrapping the insulating body 31.

The insulating body 31 includes a base 311 and a tongue plate 313 extending forwards from the base 311, and further has two rows of terminal receiving slots 315 extending forwards from an rear end of the base 311 to a top surface and a bottom surface of the tongue plate 313, respectively.

Figure 5:
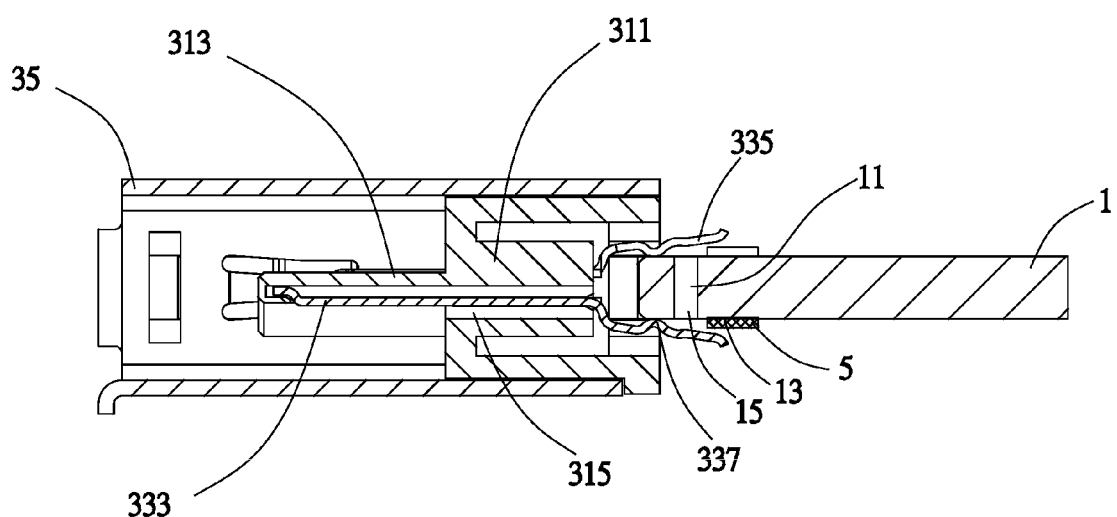
FIG. 5 is a sectional view of the electronic assembly in FIG. 1 when a circuit board and an electronic element are just inserted.
Figure 6:
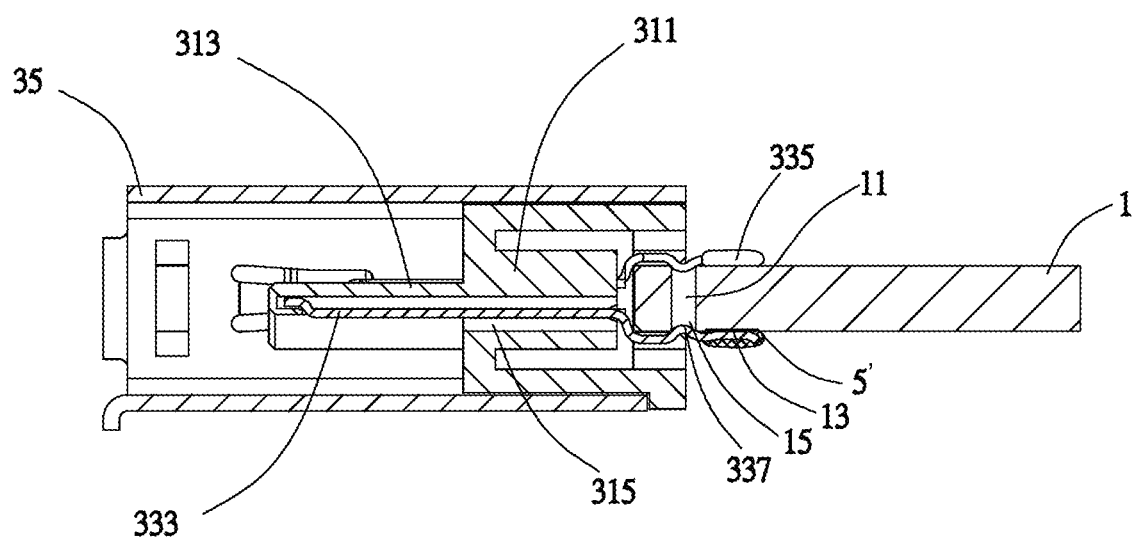
FIG. 6 is a sectional view of the electronic assembly in FIG. 1 when the circuit board and the electronic element are inserted to a preset position.

The terminals 33 are arranged into an upper row and a lower row (if the terminals 33 only needs to be soldered on one surface of the circuit board 1, the terminals 33 only needs to be arranged into one row), which are corresponding to the terminal receiving slots 315 respectively. Each of the terminals 33 includes a fixing portion 331 fixed to the base 311, a mating portion 333 extending forwards from the fixing portion 331, and a soldering portion 335 extending backwards from the fixing portion 331 and located on a rear end of the fixing portion 331. After assembly, the mating portion 333 is accommodated in the tongue plate 313 with at least a part exposed out of the tongue plate 313 to mate with the mating electronic element (as shown in FIGS. 5 and 6). An inward protruding portion 337 is disposed on a tail end of each of the soldering portions 335, and positions of the protruding portions 337 and the soldering portions 335 are corresponding to the depressions 15 and the solder pads 13 on the circuit board 1. Due to the height of the protruding portions 337 and the soldering portions 335, when the electronic element 3 is inserted along the end edge, the protruding portions 337 are firstly propped open by the circuit board 1, and drive the soldering portions 335 to deflect outwards and be located at an outer side of the solder pastes 5 correspondingly disposed on the solder pads 13, and when the electronic element 3 is inserted to a prearranged position and the protruding portions 337 enter into the depressions 15, the soldering portions 335 of the terminals return and contact the solder pastes 5.

A method for manufacturing the electronic assembly as set forth above in one embodiment includes fives steps, which are described below.

In a first step, the circuit board 1 is provided.

In a second step, a plurality of solder pastes 5 are provided, and are respectively disposed on the corresponding solder pads 13.

In a third step, the electronic element 3 is provided.

In a fourth step, the electronic element 3 is inserted into the circuit board 1 along the end edge, and during the process, the protruding portions 337 are firstly propped open by the circuit board 1, and drive the soldering portions 335 to deflect outwards and not contact the corresponding solder pastes (as shown in FIG. 5), and when the electronic element 3 is inserted into a prearranged position, the protruding portions 337 enter into the depressions 15, and the soldering portions 335 of the terminals return and contact the solder pastes 5 (as shown in FIG. 6).

In a fifth step, heating is performed (always in a heating oven) to melt the solder pastes 5 into a solder material 5', and the soldering portions 335 of the terminals 33 are respectively connected to the corresponding solder pads 13 (as shown in FIG. 6).

The steps are not necessarily to be performed in sequence. For example, the third step may be performed first before other steps, which will be apparent to those skilled in the art from the above description.

In another embodiments, the electronic element 3 is inserted along the end edge, the protruding portion 337 is firstly propped open by the circuit board 1, and drives the soldering portion 335 to deflect outwards and be located at an outer side of the solder paste 5 correspondingly disposed on the solder pad 13, such that soldering portion 335 will not push the solder paste 5, and thus not only enough volume of solder pastes and good soldering are ensured, but also the adjacent solder pastes will not contact each other, thereby avoiding short circuit.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electronic assembly, comprising:
   a circuit board, wherein a solder pad is disposed at a position close to an end edge on at least one surface of the circuit board, and a depression is disposed between the solder pad and the end edge; and
   an electronic element, comprising an insulating body and a plurality of terminals fixed to the insulating body, each of the terminals has a protruding portion and a soldering portion respectively corresponding to the depression and the solder pad, and due to the height of the protruding portion and the soldering portion, when the electronic element is inserted along the end edge, the protruding portion is firstly propped open by the circuit board, and drives the soldering portion to deflect outwards and be located at an outer side of a solder paste correspondingly disposed on the solder pad, and when the electronic element is inserted to a prearranged position and the protruding portion enters into the depression, the soldering portion of the terminal returns and contacts the solder paste.

2. The electronic assembly according to claim 1, wherein the solder pads are disposed on a top surface and a bottom surface of the circuit board, and correspondingly, the soldering portions of the electronic element are arranged into two rows to match the solder pads on the top surface and the bottom surface respectively.

3. The electronic assembly according to claim 1, wherein each surface has a plurality of solder pads thereon, and each of the solder pads is corresponding to one of the depressions disposed thereon.

4. The electronic assembly according to claim 1, wherein each surface has a plurality of solder pads thereon, and the depression is strip-shaped and is corresponding to all the solder pads on the same surface.

5. The electronic assembly according to claim 1, wherein the circuit board has a through hole disposed between the end edge and the solder pad, and an opening of the through hole forms the depression.

6. The electronic assembly according to claim 1, wherein the electronic element is an electrical connector, for connecting an external electronic element to the circuit board, each of the terminals further comprises a fixing portion fixed to the insulating body and a mating portion extending forwards from the fixing portion and electrically connected to the external electronic element, and the soldering portion is located at a rear end of the fixing portion.

7. The electronic assembly according to claim 6, wherein a tongue plate is disposed at a front part of the insulating body, and the mating portion of each of the terminals is received in the tongue plate with at least a part exposed out of the tongue plate.

8. A method for manufacturing an electronic assembly, comprising:
   providing a circuit board, wherein a solder pad is disposed at a position close to an end edge on at least one surface of the circuit board, and a depression is disposed between the solder pad and the end edge;
   providing a solder paste, correspondingly disposed on the solder pad;
   providing an electronic element, wherein the electronic element comprises an insulating body and a plurality of terminals fixed to the insulating body, and each of the terminals has a protruding portion and a soldering portion respectively corresponding to the depression and the solder pad;
   inserting the electronic element into the circuit board along the end edge, and during the process, the protruding portion is firstly propped open by the circuit board, and drives the soldering portion to deflect outwards and not contact the corresponding solder paste, and when the electronic element is inserted to a prearranged position, the protruding portion enters into the depression, and the soldering portion of the terminal returns and contacts the solder paste; and
   heating to melt the solder paste, so as to electrically connect the soldering portion and the solder pad.

9. The manufacturing method according to claim 8, wherein the solder pads are disposed on a top surface and a bottom surface of the circuit board, and correspondingly, the soldering portions of the electronic element are arranged into two rows to match the solder pads on the top surface and the bottom surface respectively.

10. The manufacturing method according to claim 8, wherein the circuit board has a through hole disposed between the end edge and the solder pad, and an opening of the through hole forms the depression.

\* \* \* \* \*